US009257979B2

(12) United States Patent
Yeh et al.

(10) Patent No.: US 9,257,979 B2
(45) Date of Patent: *Feb. 9, 2016

(54) EMBEDDED JFETS FOR HIGH VOLTAGE APPLICATIONS

(71) Applicant: Taiwan Semiconductor Manufacturing Company, Ltd., Hsin-Chu (TW)

(72) Inventors: Jen-Hao Yeh, Kaohsiung (TW); Chih-Chang Cheng, Hsin-Chu (TW); Ru-Yi Su, Kouhu Township (TW); Ker Hsiao Huo, Taichung (TW); Po-Chih Chen, Hsinchu (TW); Fu-Chih Yang, Fengshan (TW); Chun-Lin Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/166,475

(22) Filed: Jan. 28, 2014

(65) Prior Publication Data

US 2014/0139282 A1    May 22, 2014

Related U.S. Application Data

(63) Continuation of application No. 13/481,462, filed on May 25, 2012, now Pat. No. 8,704,279.

(51) Int. Cl.
*H01L 21/337* (2006.01)
*H03K 17/22* (2006.01)
(Continued)

(52) U.S. Cl.
CPC .......... *H03K 17/223* (2013.01); *H01L 29/0692* (2013.01); *H01L 29/404* (2013.01); *H01L 29/66893* (2013.01); *H01L 29/66901* (2013.01); *H01L 29/808* (2013.01)

(58) Field of Classification Search
USPC .................................................. 438/196, 186
See application file for complete search history.

(56) References Cited

U.S. PATENT DOCUMENTS 5,973,341 A    10/1999   Letavic et al.
6,433,374 B1    8/2002   Fukunaga et al.
(Continued)

FOREIGN PATENT DOCUMENTS

JP    2010284731    12/2010
KR    20090070783    7/2009
(Continued)

OTHER PUBLICATIONS

Appels, J.A. "Thin Layer High-Voltage Junction FET (Resurf JFET)," IEEE Electron Device Letters, vol. EDL-2, No. 2, Feb. 1981, 3 pages.
(Continued)

*Primary Examiner* — Timor Karimy
(74) *Attorney, Agent, or Firm* — Slater & Matsil, L.L.P.

(57) ABSTRACT

A device includes a buried well region and a first HVW region of the first conductivity, and an insulation region over the first HVW region. A drain region of the first conductivity type is disposed on a first side of the insulation region and in a top surface region of the first HVW region. A first well region and a second well region of a second conductivity type opposite the first conductivity type are on the second side of the insulation region. A second HVW region of the first conductivity type is disposed between the first and the second well regions, wherein the second HVW region is connected to the buried well region. A source region of the first conductivity type is in a top surface region of the second HVW region, wherein the source region, the drain region, and the buried well region form a JFET.

20 Claims, 13 Drawing Sheets

(51) Int. Cl.
*H01L 29/40* (2006.01)
*H01L 29/66* (2006.01)
*H01L 29/808* (2006.01)
*H01L 29/06* (2006.01)

(56) References Cited

U.S. PATENT DOCUMENTS 7,605,428 B2 10/2009 Williams et al.
7,737,526 B2 6/2010 Williams et al.
2008/0074908 A1 3/2008 Chang et al.
2014/0231884 A1 8/2014 Yeh et al.

FOREIGN PATENT DOCUMENTS

TW 200816475 4/2008
TW 200847330 12/2008

OTHER PUBLICATIONS

Liaw, Chorng-Wei et al., "Pinch-Off Voltage-Adjustable High-Voltage Junction Field-Effect Transistor," IEEE Electron Device Letters, vol. 28, No. 8, Aug. 2007, 3 pages.

EMBEDDED JFETS FOR HIGH VOLTAGE APPLICATIONS

This application is a continuation of U.S. patent application Ser. No. 13/481,462, entitled "Embedded JFETS on High Voltage Applications," filed on May 25, 2012, now U.S. Pat. No. 8,704,279, which application is incorporated herein by reference.

BACKGROUND

Junction Field-Effect Transistor (JFET) is a type of field-effect transistor that can be used as an electronically-controlled switch or as a voltage-controlled resistor. In a JFET, electric charges flow through a semiconducting channel between a source and drain. By applying a bias voltage to a gate, the channel of the JFET may be pinched, so that the electric current flowing between the source and the drain is impeded or switched off.

JFETs have various structures. The different structures of the JFETs were design to suit for different usages of the JFETs. For example, the JFETs may be designed to be applied with high drain voltages, high currents, or the like.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A high voltage Junction Field-Effect Transistor (JFET) is provided in accordance with various exemplary embodiments. The variations and the operation of the embodiments are discussed. Throughout the various views and illustrative embodiments, like reference numbers are used to designate like elements. In the illustrated embodiments, n-type JFETs are provided to explain the concept of the embodiments. It is appreciated that the teaching in the embodiments is readily available for the formation of p-type JFETs, with the conductivity types of the respective doped regions inverted.

Figure 1A:
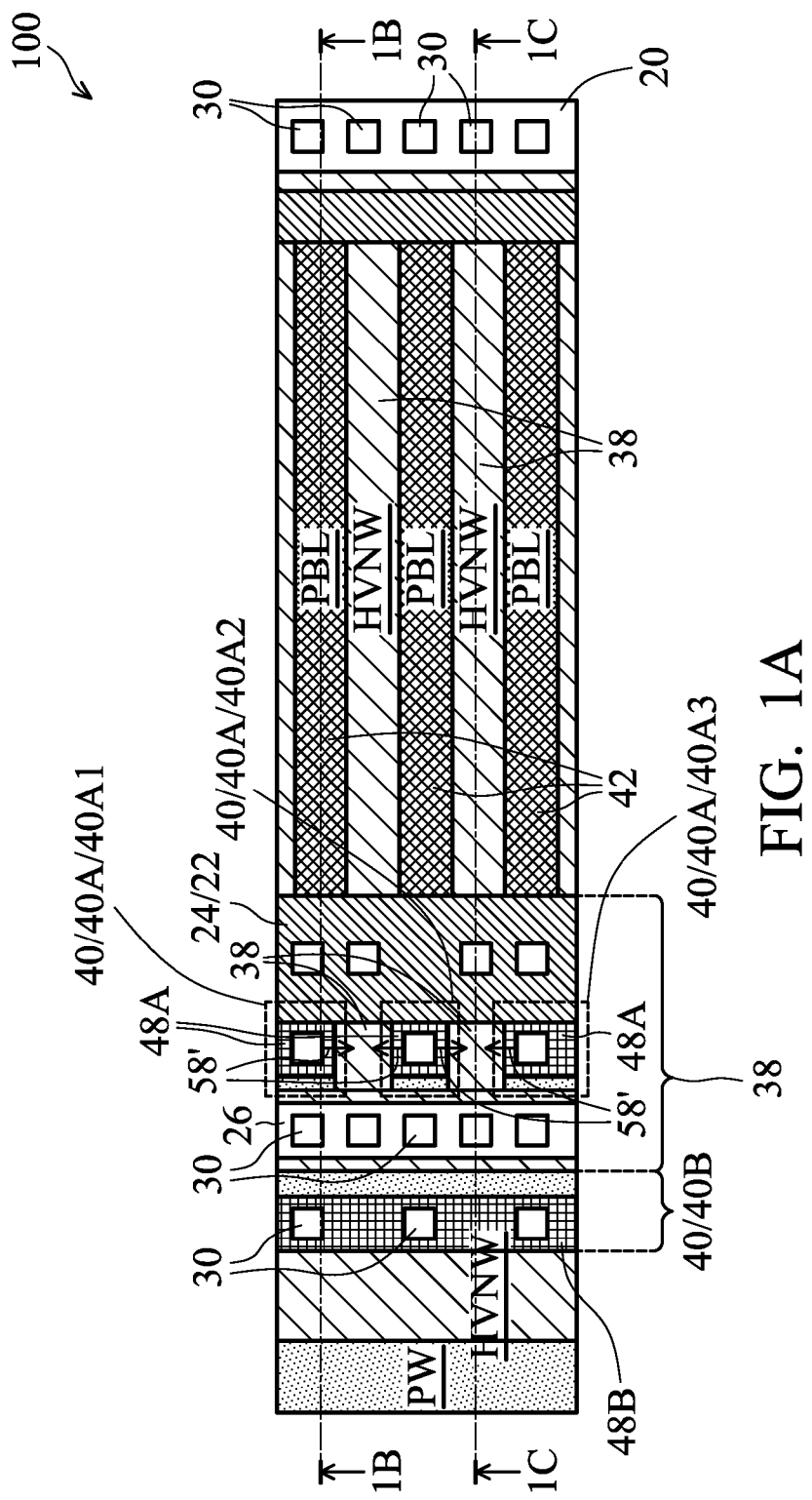
FIGS. 1A through 4C are top views and cross-sectional views of Junction Field-Effect Transistors (JFETs) in accordance with some exemplary embodiments.
Figure 1B:
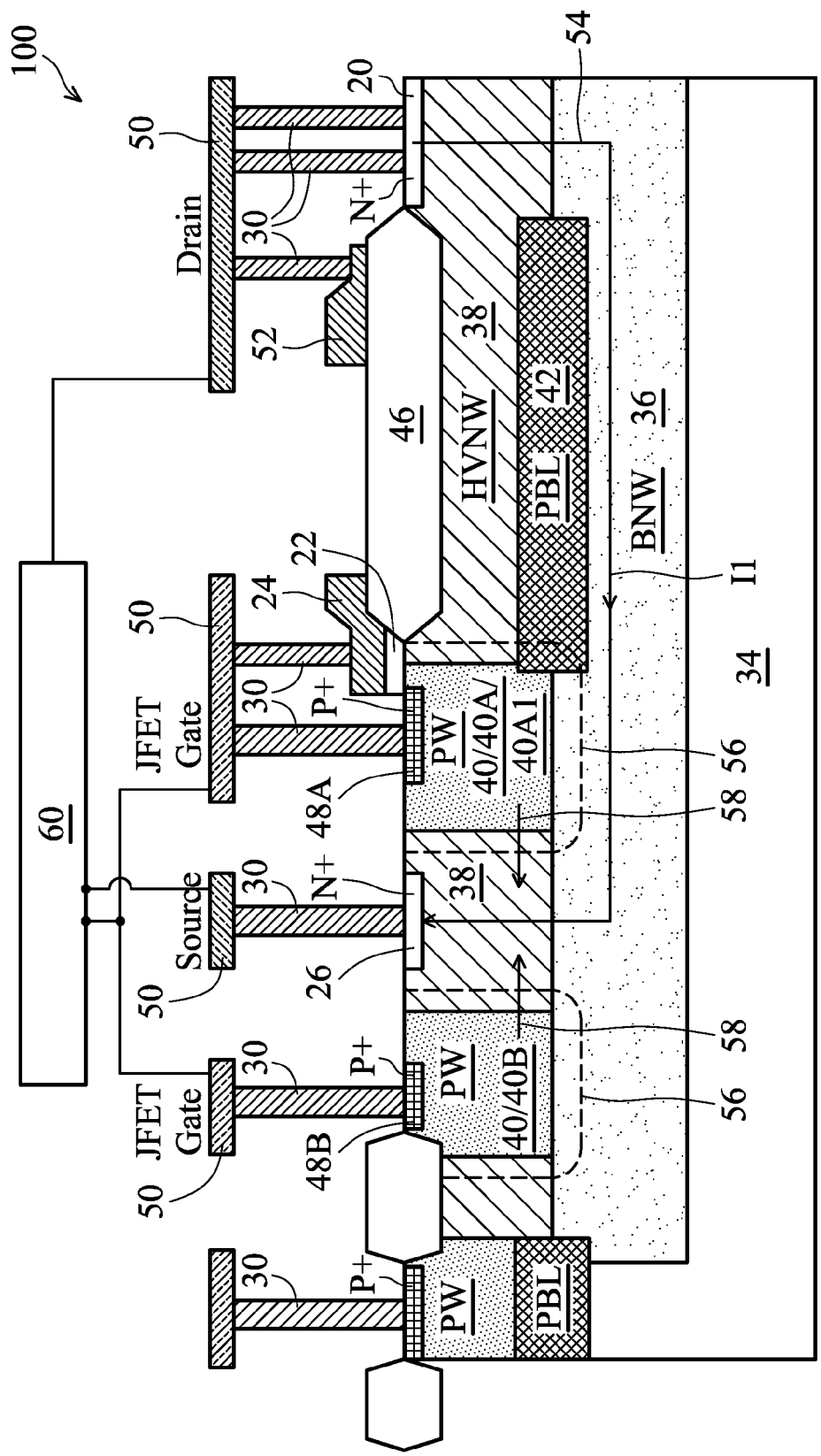
Figure 1C:
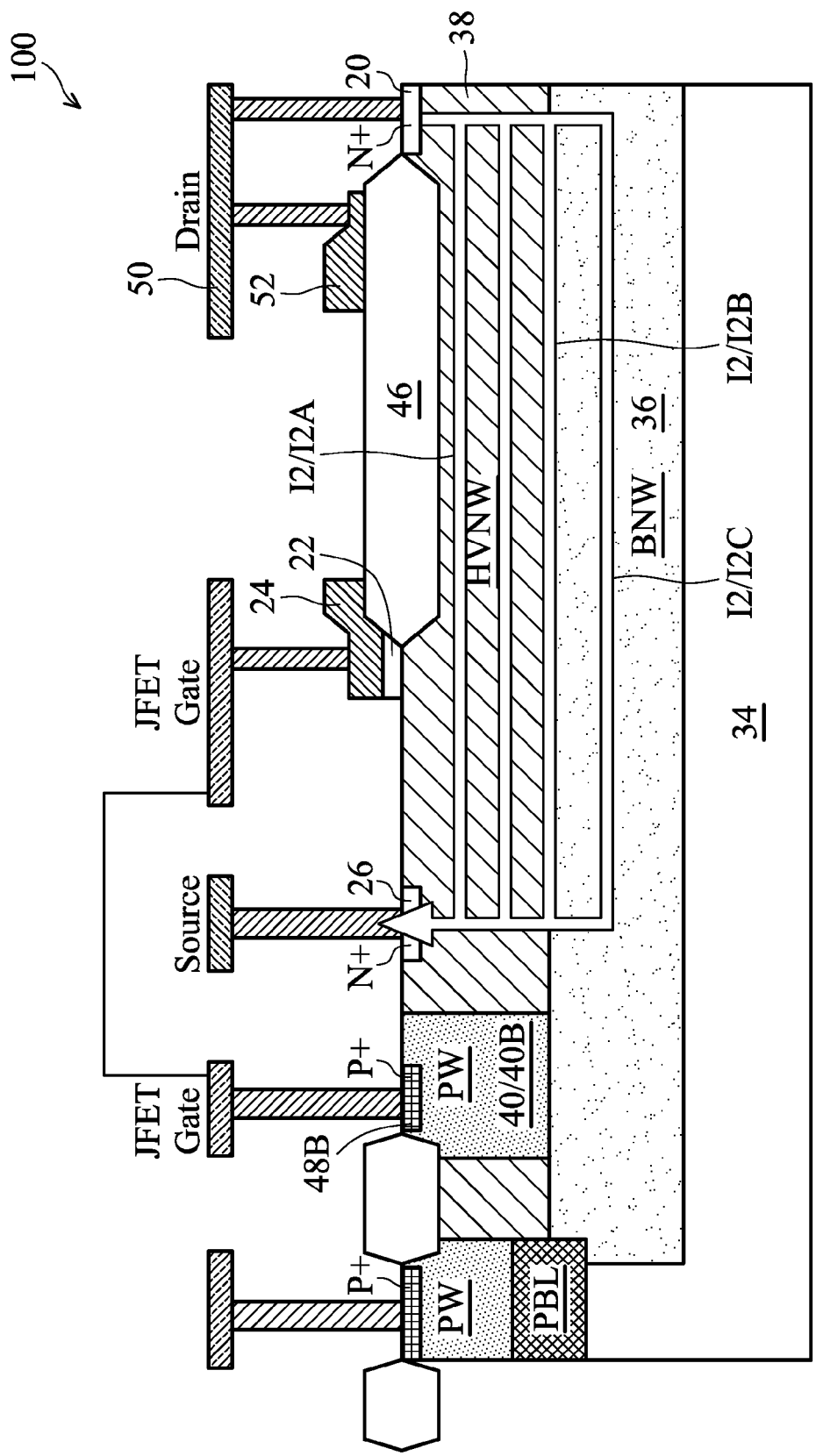

FIGS. 1A through 1C are a top view and cross-sectional views of JFET 100 in accordance with some exemplary embodiments. Referring to FIG. 1A, which is a top view, JFET 100 includes drain region 20, gate electrode 24, and source region 26. Gate electrode 24 is disposed between drain region 20 and source region 26. A plurality of contacts 30 are formed over and electrically couple to the respective underlying drain region 20, gate electrode 24, and source region 26. Furthermore, High-Voltage N-Well (HVNW) 38, P-Wells 40 (including 40A and 40B), and P-type Buried Layers (PBLs) 42 are also included in JFET 100.

FIG. 1B illustrates a cross-sectional view of JFET 100 as shown in FIG. 1A, wherein the cross-sectional view is obtained from the plane crossing line 1B-1B in FIG. 1A. JFET 100 is formed over substrate 34, which may be a p-type substrate, for example, although an n-type substrate may also be used. Buried N-Well (BNW) 36 is formed over substrate 34. In some embodiments, BNW 36 is doped with an n-type impurity to an impurity concentration, for example, between about $10^{14}/cm^3$ and about $10^{17}/cm^3$. Over BNW 36, HVNW 38 and PW regions 40 are formed. HVNW 38 and PW regions 40 may be doped with an n-type impurity and a p-type impurity, respectively, to impurity concentrations about $10^{14}/cm^3$ and about $10^{17}/cm^3$, for example. PBL 42 is formed under HVNW 38 and over BNW 36, and is of p-type. The impurity concentration of PBL 42 may be between about $10^{15}/cm^3$ and about $10^{17}/cm^3$. Drain region 20 and source region 26 are heavily doped (represented by a "+" sign) n-type regions, which may have an n-type impurity concentration greater than about $10^{19}/cm^3$, or between about $10^{19}/cm^3$ and about $10^{21}/cm^3$.

Insulation region 46 is formed over HVNW 38. In some embodiments, insulation region 46 is a field oxide region formed through the oxidation of silicon. In alternative embodiments, insulation region 46 may be a Shallow Trench Isolation (STI) region. A portion of PBL 42 is under and aligned to insulation region 46. The formation of PBL 42 may be used for Reducing Surface electric Field (RESURF), which electric field may be high due to the high voltage applied on drain region 20.

PW regions 40 include PW regions 40A and PW 40B, which are spaced apart from each other by portions of HVNW 38, in which source region 26 is formed. As shown in FIG. 1A, PW regions 40A also includes PW regions 40A1, 40A2, and 40A3, with each connected to one of PBLs 42. Accordingly, when a voltage is applied to PW regions 40A, the voltage may be applied to PBLs 42 through PWs regions 40A. Referring to FIG. 1B, in some embodiments, heavily doped p-type (P+) regions 48A and 48B are formed in PW regions 40A and 40B, respectively. P+ regions 48A and 48B act as the pickup regions of PW regions 40A and 40B, respectively. PW regions 40A and 40B may be electrically interconnected through overlying metal connections, and hence are at a same voltage level during the operation of JFET 100.

Gate dielectric 22 and gate electrode 24 are formed over and aligned to HVNW 38, insulation region 46, and may extend over PW regions 40A. In some embodiments, P+ region 48A and gate electrode 24 are electrically interconnected through contact plugs 30 and one of metal lines 50, so that the same voltage may be applied to gate electrode 24 and P+ regions 48A, and hence to PW regions 40A. Conductive feature 52, which may be formed simultaneously when gate electrode 24 is formed, is over insulation region 46, and may be electrically connected to drain region 20 through contact plugs 30 and one of metal lines 50.

Referring to FIG. 1B, it is observed that there is a current channel between and connected to drain region 20 and source regions 26, wherein the current channel (illustrated as arrow 54) is formed of n-type regions. A first current I1 may flow through current channel 54 and between drain region 20 and source regions 26. The current channel 54 includes the portion of HVNW 38 under drain region 20, BNW 36 (which is under PBL 42), and the portion of HVNW 38 between PW regions 40A and 40B. Voltage source 60 supplies voltages to drain region 20, PW regions 40A/40B, and source region 26. When appropriate voltages are applied to drain region 20, PW regions 40A/40B, and source region 26, current I1 flows through current channel 54. Voltage source 60 may also be configured to adjust the voltages applied on drain region 20, PW regions 40A/40B, and source region 26 to turn off JFET 100. For example, depletion regions 56 are schematically illustrated, which are formed due to the junctions between PW regions 40A/40B and HVNW 38 and BNW 36. By increasing the bias voltages on source region 26, and/or reducing the bias on PW regions 40A and 40B, depletion regions 56 grow in the direction shown by arrows 58. When the bias voltage reaches the pinch-off voltage of JFET 100, depletion regions 56 from opposite sides eventually join with each other. The current channel 54 is thus pinched off by PW regions 40A/40B, and current I1 is turned off. Accordingly, PW regions 40A and 40B may be used to pinch off current I1. It is observed that by adjusting the spacing between PW regions 40A and 40B, the pinch-off voltage may be adjusted.

FIG. 1C illustrates a cross-sectional view of JFET 100 as shown in FIG. 1A, wherein the cross-sectional view is obtained from the plane crossing line 1C-1C in FIG. 1A. FIG. 1C illustrates a second current channel that flows between drain region 20 and source region 26. The current flowing in the second current channel is represented as I2. It is observed that current I2 includes portions I2A, I2B, and I2C. Current portion I2A is in HVNW 38, and is at a level higher than PBL 42 (please refer to FIG. 1B). Current portion I2B is at the same level as PBL 42. Current portion I2C is in BNW 36, and is at the level lower than PBL 42.

Referring back to FIG. 1A, PW portions 40A1, 40A2, and 40A3 also form depletion regions with the surrounding HVNW 38. Similar to the operation of current I1 in FIG. 1B, by increasing the bias voltage on source region 26, and/or reducing the bias voltage on PW regions 40A1, 40A2, and 40A3, the respective depletion regions grow toward each other (and in the direction shown as arrows 58'), and eventually join with each other. The current I2 as in FIG. 1C is thus pinched by PW regions 40A1, 40A2, and 40A3. It is observed that by adjusting the spacing between PW regions 40A1, 40A2, and 40A3, the pinch-off voltage may be adjusted.

As illustrated in FIGS. 1B and 1C, the current between drain region 20 and source region 26 includes current I1 (FIG. 1B) and current I2 (FIG. 1C). Current I1 flows from underlying PW regions 40 upward to reach source region 26. Current I2 flows between neighboring PW regions 40A1, 40A2, and 40A3, and between neighboring PBLs 42. Accordingly, the respective current between source region 26 and drain region 20 is three dimensional. Since the current include both current I1 and current I2, the current may be higher than if there is one of currents I1 and I2.

FIGS. 2A through 4C illustrate top views and cross-sectional views of JFETs 200, 300, and 400 in accordance with alternative embodiments. Unless specified otherwise, the materials and the characteristics of the components in these embodiments are essentially the same as the like components, which are denoted by like reference numerals in the embodiments shown in FIGS. 1A through 1C.

Figure 2A:
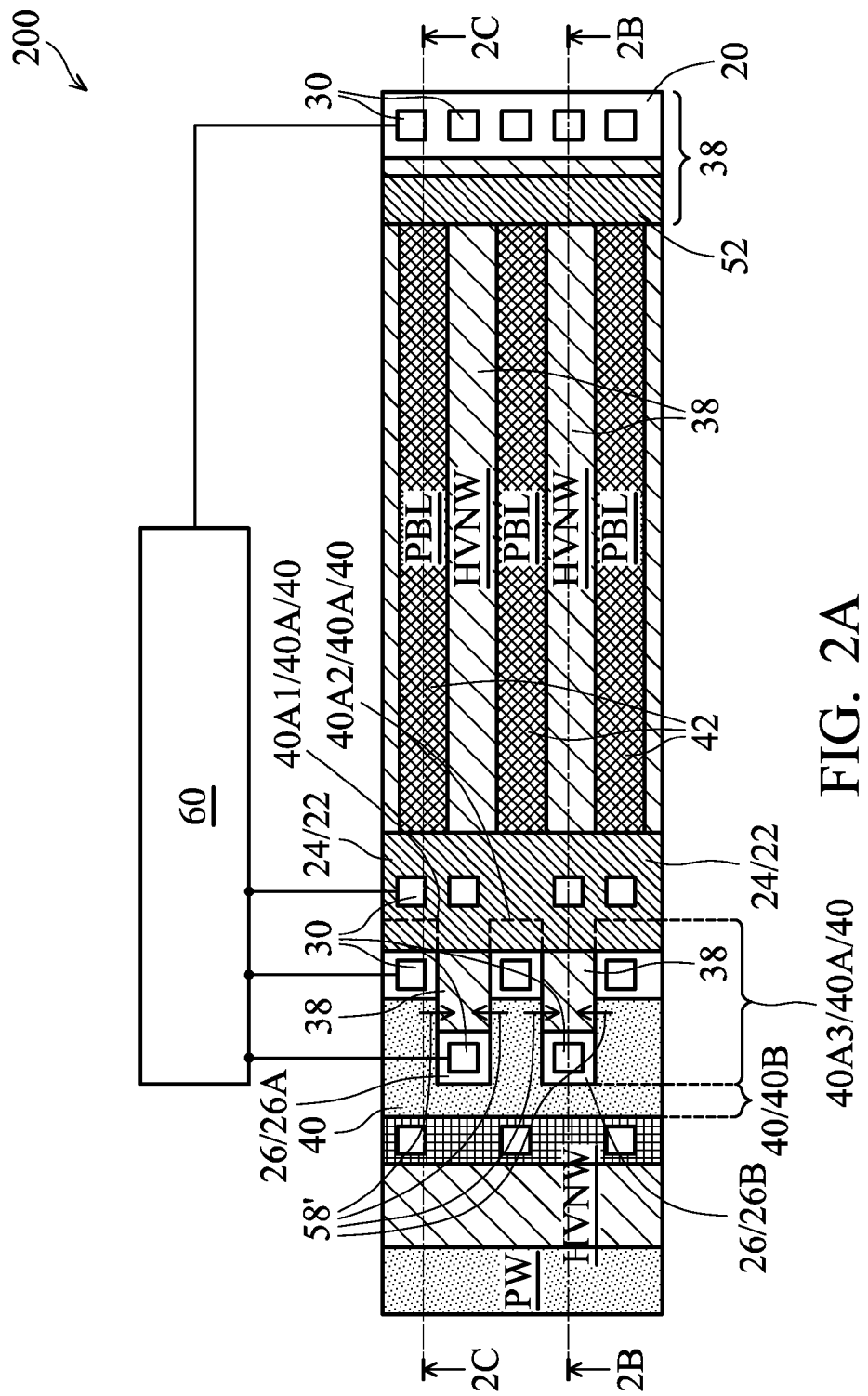

FIG. 2A illustrate a top view of JFET 200. JFET 200 has a similar top view as that of JFET 100 in FIG. 1A, except that the PW regions 40B, 40A1, 40A2, and 40A3 in FIG. 1A are merged with each other to form the continuous PW region 40 in FIG. 2A. Alternatively stated, the PW region 40 as in FIG. 2A may be considered as extending PW regions 40A1, 40A2, and 40A3 in FIG. 1A toward PW region 40B, until PW regions 40A1, 40A2, and 40A3 are merged with PW region 40B. As a result, the continuous source region 26 in FIG. 1A is now broken apart into source regions 26A and 26B. Accordingly, it may be treated as that PW region 40 includes legs 40A1, 40A2, and 40A3 that extend beyond the right edges of source regions 26A and 26B. Similarly, PW legs 40A1, 40A2, and 40A3 may pinch the current I2 (FIG. 2B) flowing from drain region 20 to source regions 26A and 26B, wherein the pinch-off of current I2 is illustrated by arrows 58' in FIG. 2A.

Figure 2B:
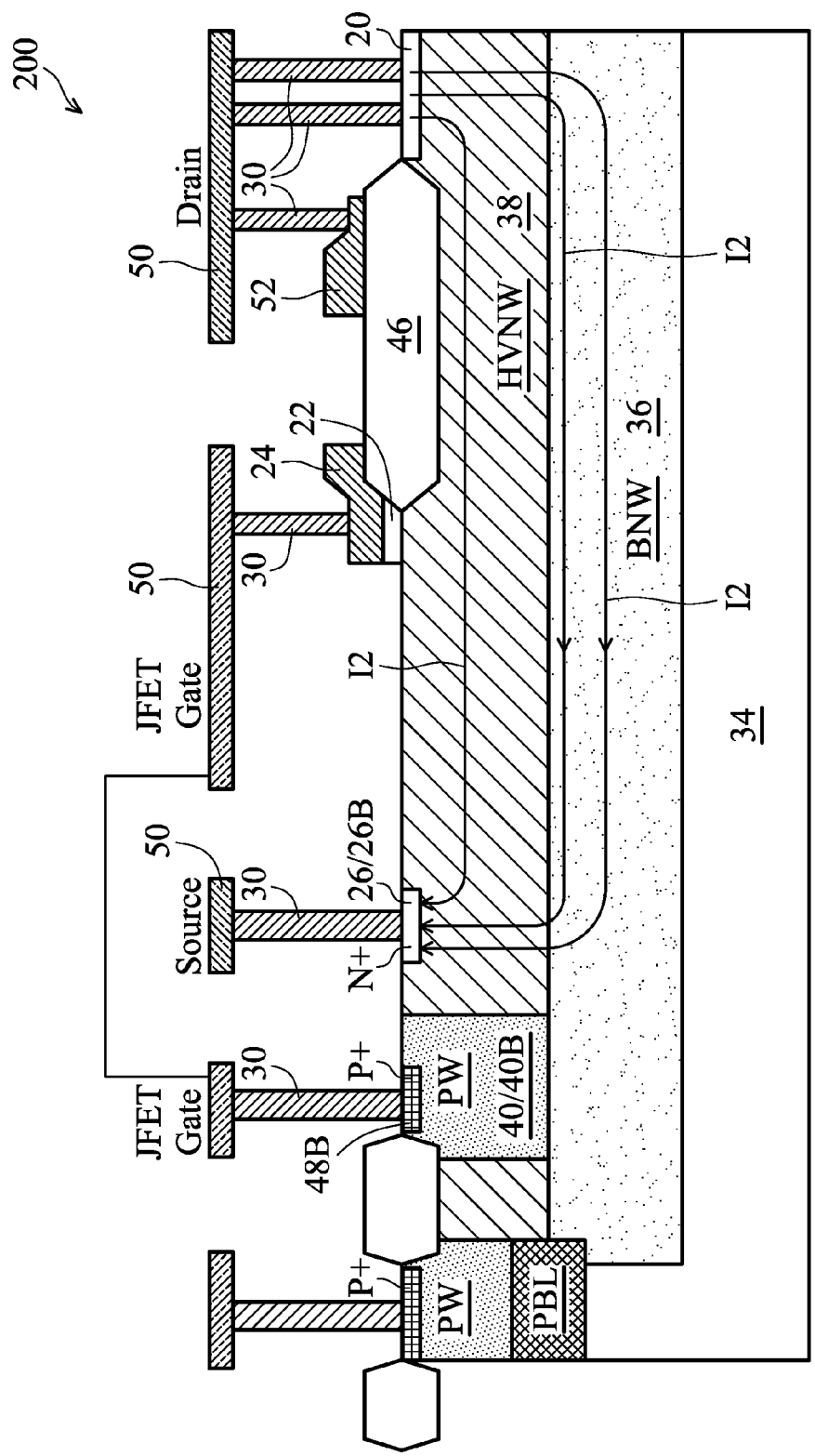

FIG. 2B illustrates a cross-sectional view that is obtained from the plane crossing line 2B-2B in FIG. 2A. It is observed that current I2 includes a portion flowing in HVNW 38, a portion in BNW 36, and a portion at the same level as PBL 42 (FIG. 2C).

Figure 2C:
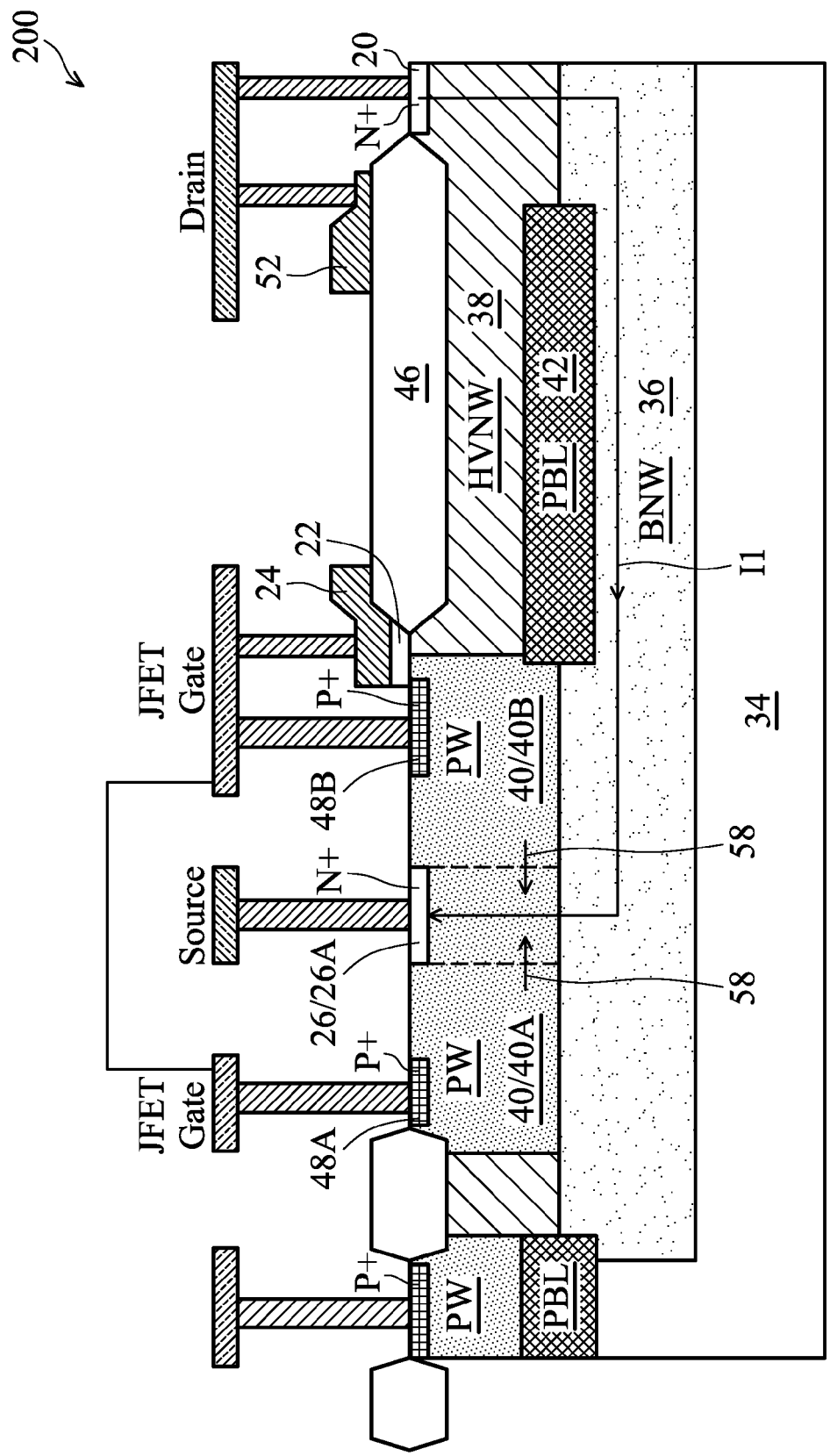

FIG. 2C illustrates a cross-sectional view that is obtained from the plane crossing line 2C-2C in FIG. 2A. As shown in FIG. 2C, current I1 can also flow in BNW 36 and reach source regions 26A and 26B. The pinch-off of current I1 is also achieved through PW region 40, wherein arrows 58 represent the growth direction of the depletion regions that are caused by the pinch-off voltage applied on PW region 40. Accordingly, the on-current of JFET 200, which also include current I1 and current I2, is also high.

Figure 3A:
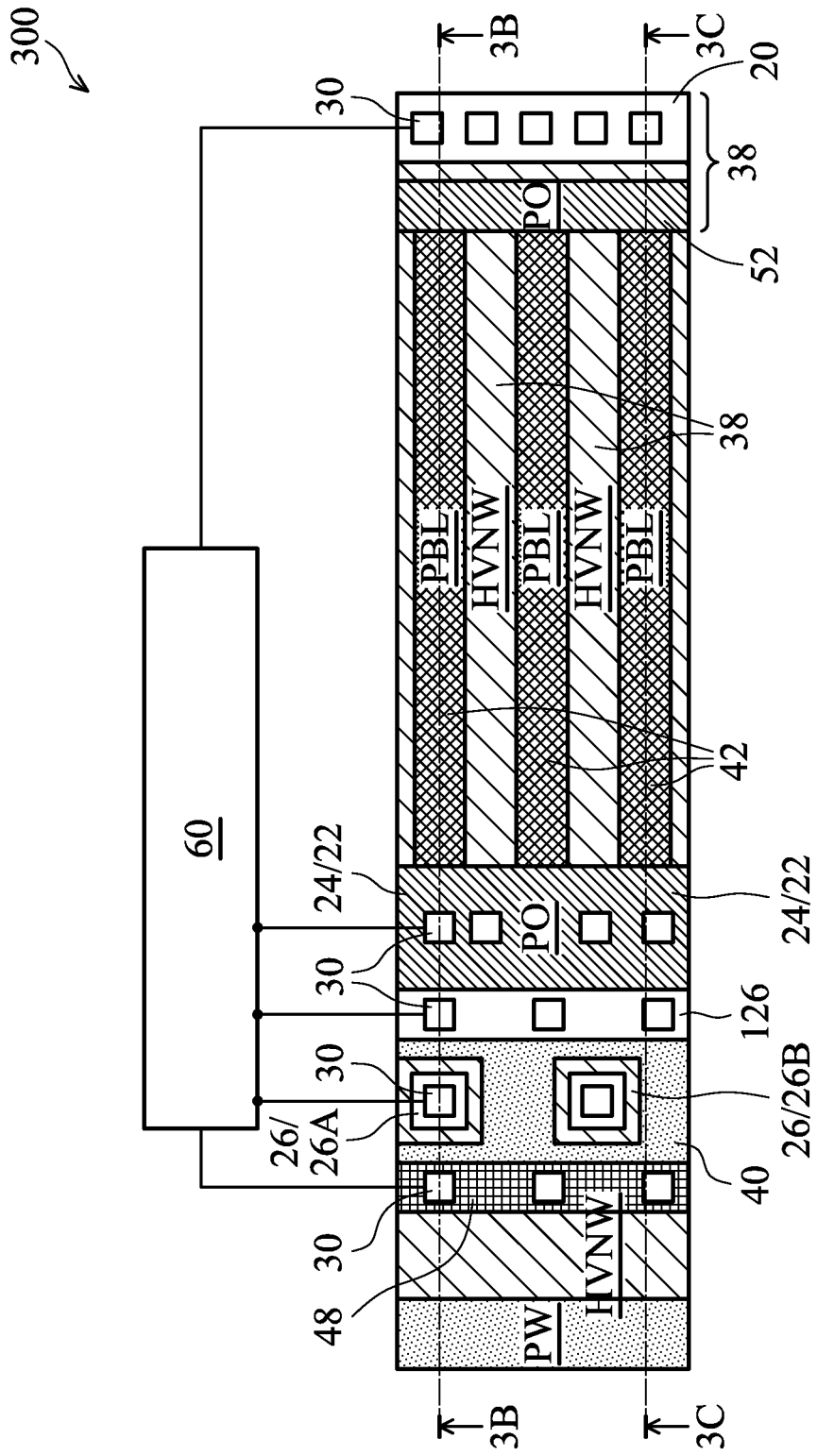

FIG. 3A illustrate a top view of JFET 300. JFET 300 has a similar top view as that of JFETs 100 in FIG. 1A and JFET 200 in FIG. 2A, except that source regions 26A and 26B are fully encircled by PW region 40, which forms a PW ring. Source regions 26A and 26B are also isolated from each other by PW region 40.

Figure 3B:
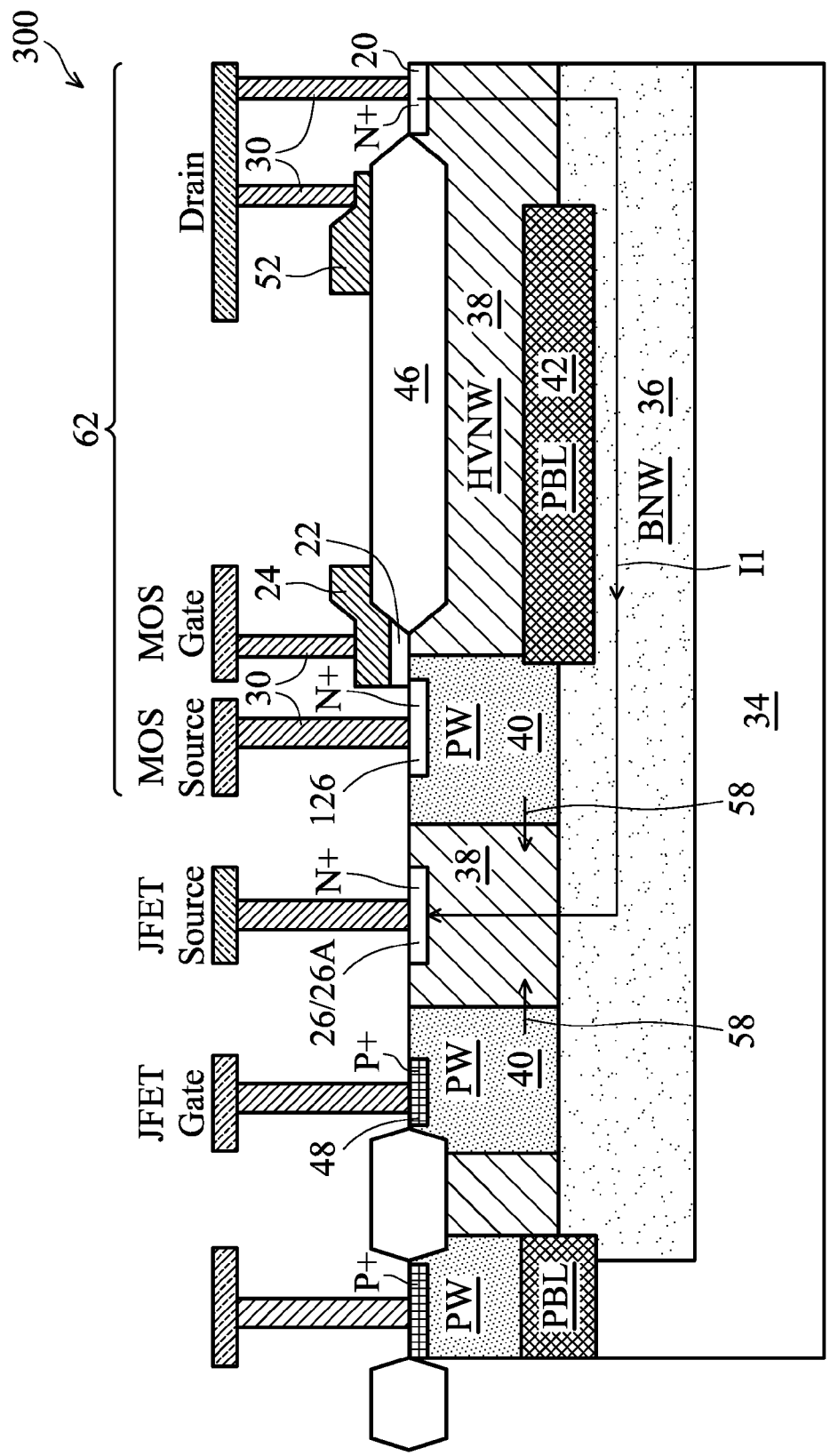

FIG. 3B illustrate a cross-sectional view that is obtained from the plane crossing line 3B-3B in FIG. 3A. As shown in FIG. 3B, current I1 can flow in BNW 36 and reach source regions 26. The pinch of current I1 is achieved through PW region 40, wherein arrows 58 represent the growth direction of the depletion regions that are caused by the voltage applied on PW region 40. The portion of HVNW 38 underlying each of source regions 26A and 26B is also fully encircled by PW region 40. It is observed that by adjusting the top view size of the portions of HVNW 38 that are surrounded by PW 40, the pinch-off voltage of JFET 300 may be adjusted.

Figure 3C:
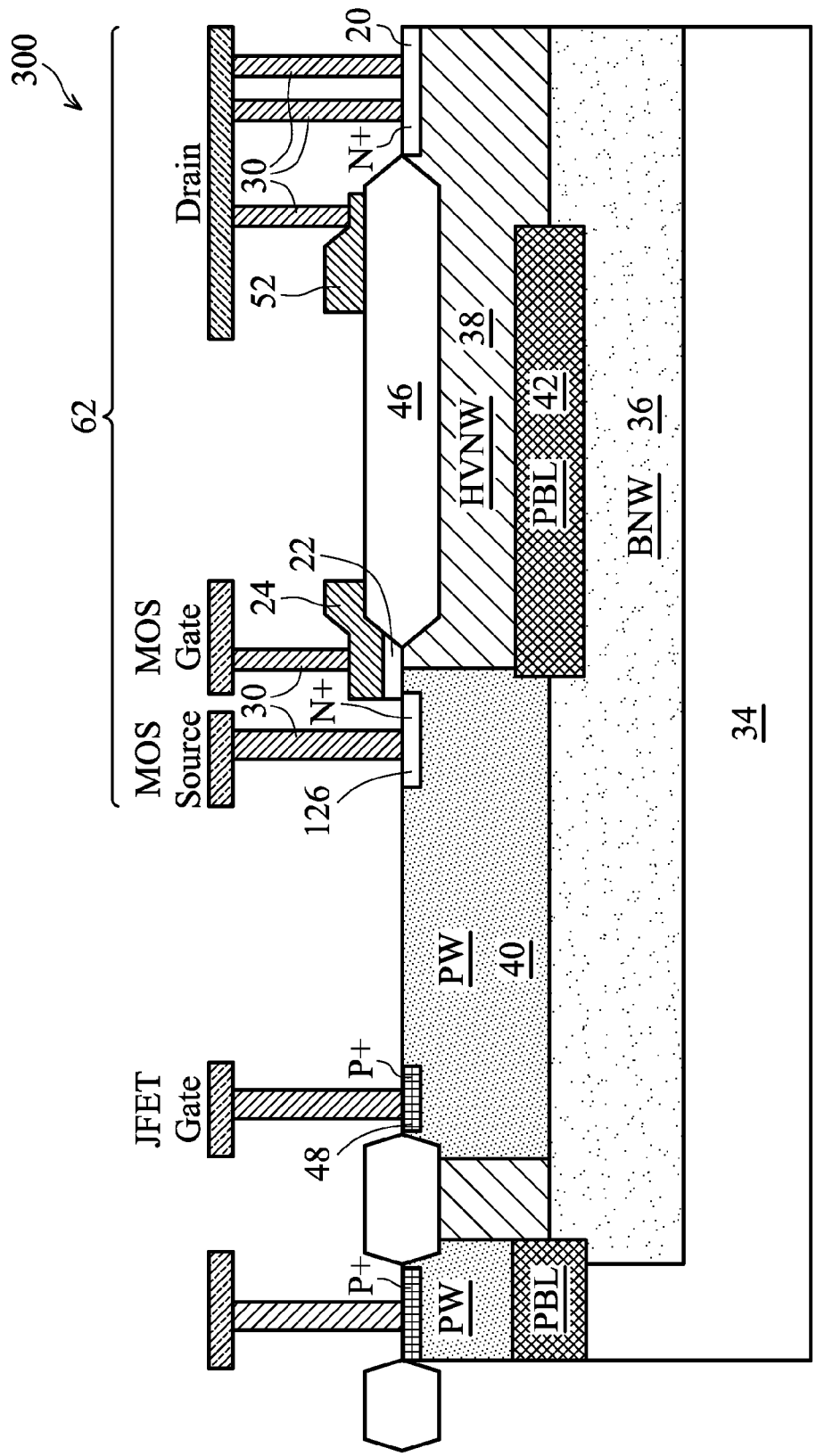

FIG. 3C illustrate a cross-sectional view that is obtained from the plane crossing line 3C-3C in FIG. 3A. It is observed that no source-drain current exists in HVNW 38 and at levels equal to or higher than the level of PBL 42, as symbolized by the "X" sign, since PW region 40 and PBL 42 are on the path of current I2.

FIGS. 3A through 3C also illustrate the decoupling of PW region 48 from gate electrode 24. By electrically decoupling PW pickup region 48 from gate electrode 24, MOS source region 126 may be formed in PW region 40. Different voltages may be applied to PW pickup region 48, MOS source region 126, and gate electrode 24. Accordingly, as shown in FIGS. 3B and 3C, MOS source region 126, gate electrode 24, and drain 20 form the source region, the gate, and the drain region, respectively, of Metal-Oxide-Semiconductor (MOS) transistor 62. Drain region 20 acts as the drain region of both MOS transistor 62 and JFET 300. On the other hand, PW pickup region 48 acts as the gate of JFET 300. The pinch-off or the turning-on of JFET 300 may be achieved by applying appropriate voltages, for example, negative voltages or ground voltages, to PW pickup region 48.

Figure 5:
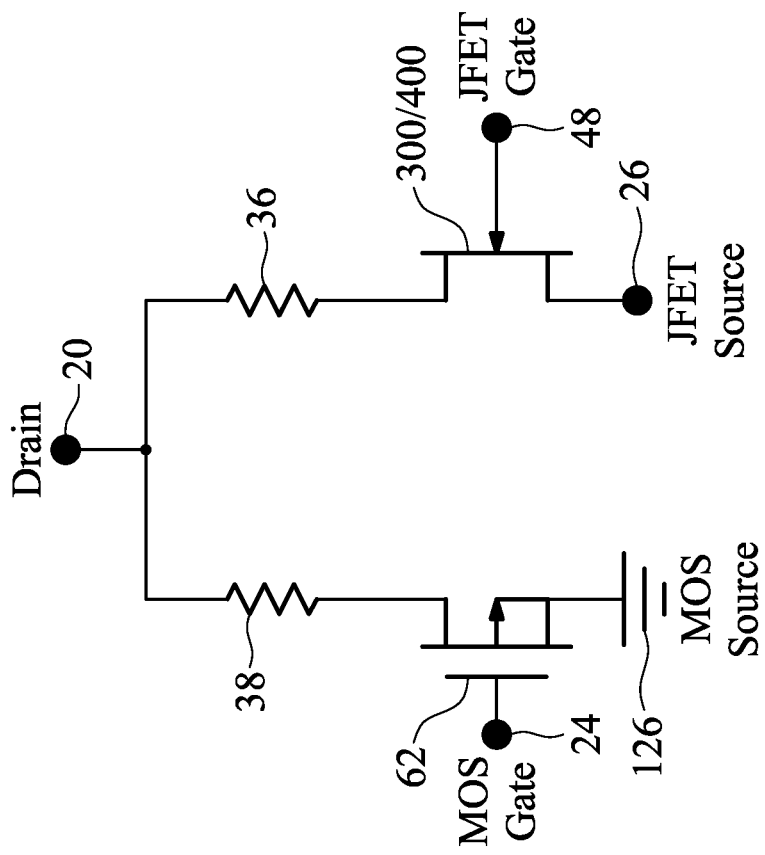
FIG. 5 illustrates an equivalent circuit diagram of the JFET shown in FIGS. 3A through 4C.

FIG. 5 illustrates an equivalent circuit diagram of the structure shown in FIGS. 3A through 3C, wherein drain region 20, source regions 126 and 26, and gates 24 and 48, of MOS transistor 62 and JFET 300, respectively, are marked. By integrating MOS transistor 62 and JFET 300, the chip area that is used by integrated MOS transistor 62 and JFET 300 in combination may be reduced.

Figure 4A:
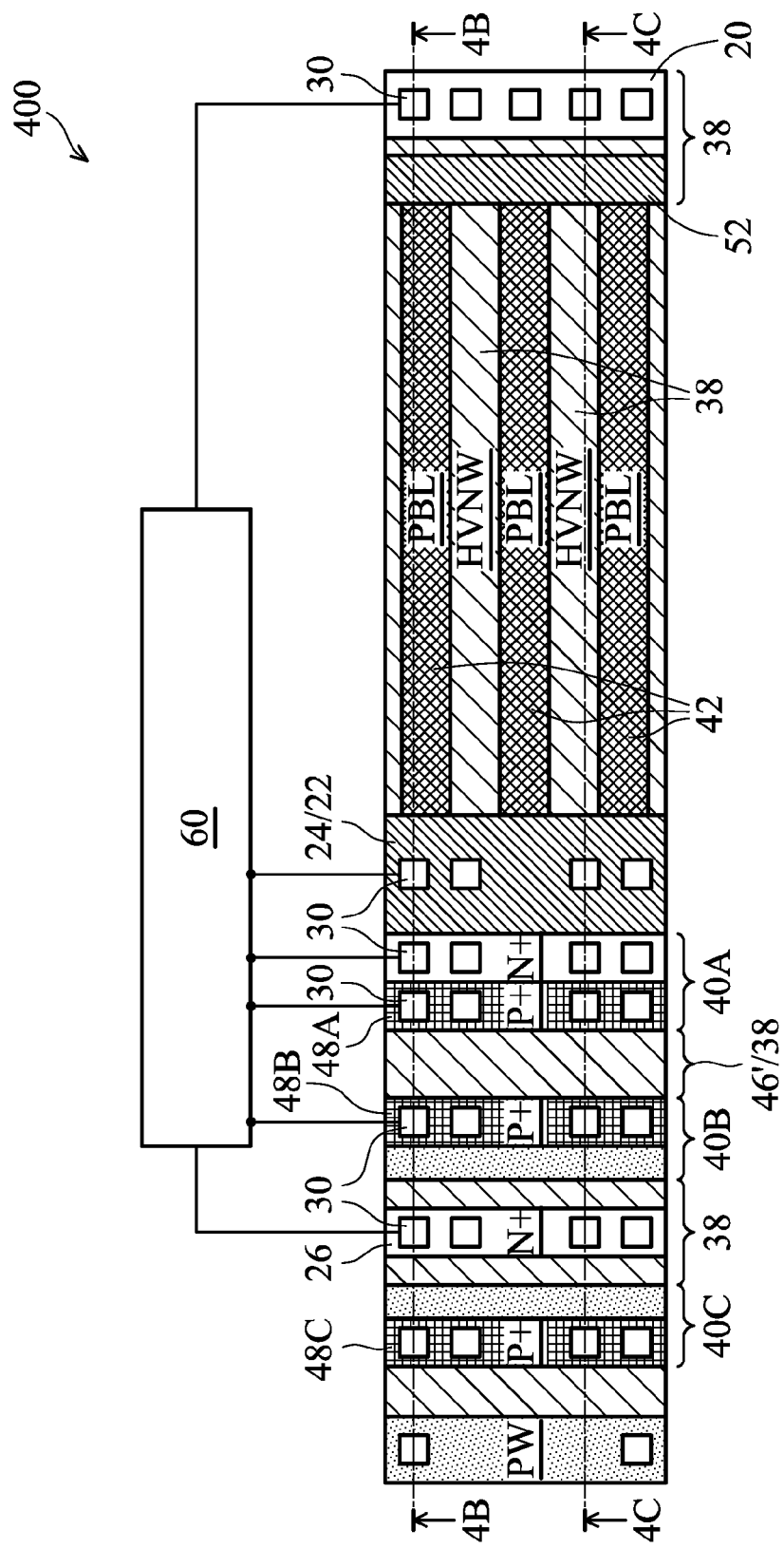

FIG. 4A illustrates a top view of JFET 400. JFET 400 has a similar top view as that of JFET 300 in FIG. 3, except that PW region 40 is separated into PW regions 40A, 40B, and 40C, which are spaced apart from each other by the separated portions of HVNW regions 38. Insulation region 46' (Please refer to FIGS. 4B and 4C) is formed over HVNW region 38 to separate PW region 40A from PW region 40B.

Figure 4B:
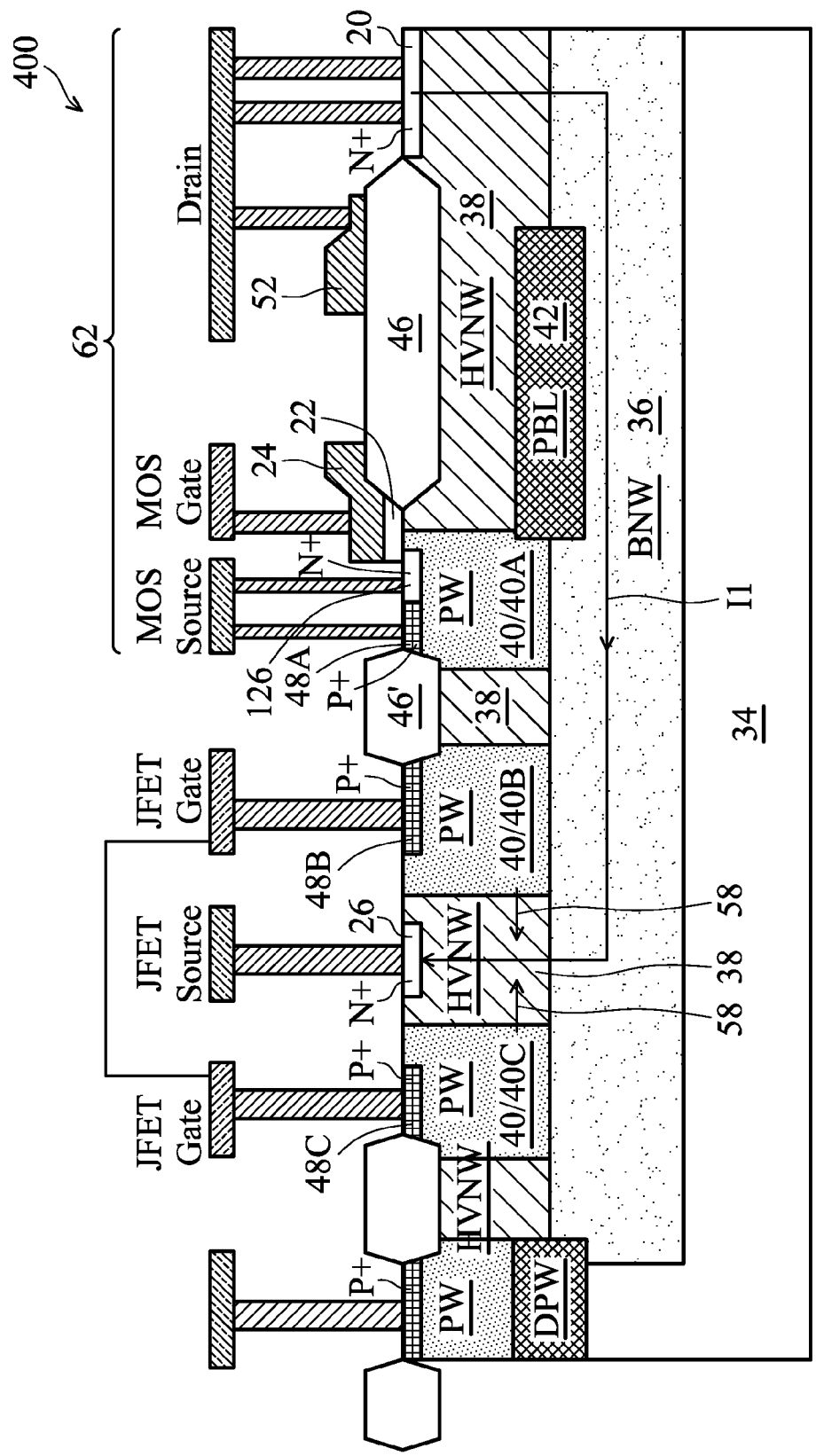
Figure 4C:
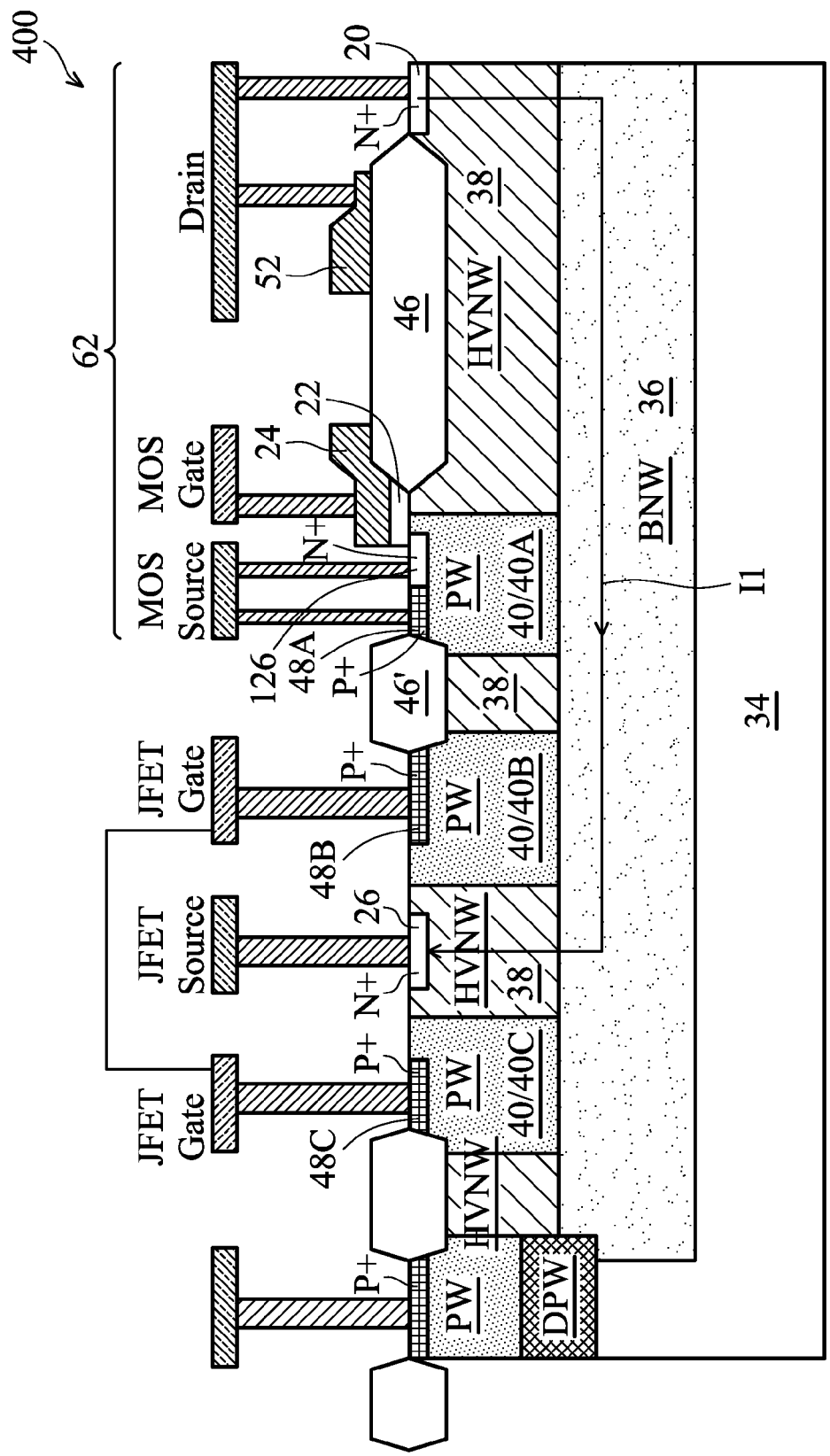

Again, MOS source region 126, gate electrode 24, and drain 20 form the source region, the gate, and the drain region, respectively of MOS transistor 62. Drain region 20 acts as the drain region of both MOS transistor 62 and JFET 400. On the other hand, PW pickup regions 48B and 48C are interconnected to act as the gate of JFET 400. The pinch-off and the turning-on of JFET 400 may be achieved by applying appropriate voltages to PW pickup regions 48B and 48C. When turned on, JFET 400 has current I1 (FIGS. 4B and 4C) that flows under PBL 42, and flows to the source region 26 of JFET 400. Current I1 is illustrated in FIGS. 4B and 4C, which are cross-sectional views obtained from the plane crossing lines 4B-4B and 4C-4C, respectively, in FIG. 4A. An equivalent circuit diagram of the structure in FIGS. 4A through 4C is also illustrated in FIG. 5.

In the embodiments, the pinch-off voltages of the JFETs may be easily adjusted by adjusting the channel width, such as the distances between PW regions 40. The embodiments also provide a solution for a high-voltage JEFT design, with the drain voltage of the JFETs in accordance with embodiment being higher than about 400 V. Due to the use of the 3D channels (for example, referring to currents I1 and I2 in FIGS. 1B and 1C), the turn-on resistance of the JFETs is low.

In accordance with some embodiments, a device includes a buried well region of a first conductivity type over the substrate, and a first HVW region of the first conductivity type over the buried well region, an insulation region over the first HVW region. A drain region of the first conductivity type is disposed on a first side of the insulation region and in a top surface region of the first HVW region. A gate electrode includes a first portion on a second side of the insulation region, and a second portion extending over the insulation region. A first well region and a second well region of a second conductivity type opposite the first conductivity type are on the second side of the insulation region. A second HVW region of the first conductivity type is disposed between the first and the second well regions, wherein the second HVW region is connected to the buried well region. A source region of the first conductivity type is in a top surface region of the second HVW region, wherein the source region, the drain region, and the buried well region form a JFET.

In accordance with other embodiments, a device includes a substrate, a buried well region of a first conductivity type over the substrate, a HVW region of the first conductivity type over the buried well region, an insulation region over the HVW region, and a drain region of the first conductivity type on a first side of the insulation region and over the HVW region. A gate electrode includes a first portion on a second side of the insulation region, and a second portion extending over the insulation region. A source region of the first conductivity type is disposed over a first portion of the HVW region, wherein the source region, the drain region, and the buried well region form a JFET. A first, a second, and a third well region of a second conductivity type opposite the first conductivity type are disposed on the second side of the insulation region and interconnected to each other, wherein the first and the second well regions are spaced apart from each other by a second portion of the HVW region. The third well region is spaced apart from the first and the second well regions by the first portion of the HVW region.

In accordance with yet other embodiments, a device includes a substrate, a buried well region of a first conductivity type over the substrate, a HVW region of the first conductivity type over the buried well region, an insulation region over the HVW region, a drain region of the first conductivity type on a first side of the insulation region and over the HVW region, and a gate electrode having a first portion on a second side of the insulation region and a second portion extending over the insulation region. A well region of a second conductivity type opposite the first conductivity type is disposed on the second side of the insulation region. The well region includes a body, and a first leg and a second leg extending from the body toward the insulation region, wherein the body and the first and the second legs contact three edges of the HVW region. A source region of the first conductivity type is disposed over a portion of the HVW region, wherein the source region is between the first and the second legs of the well region, and wherein the source region, the drain region, and the buried well region form a JFET.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   conducting a current between a source region and a drain region of a Junction Field-Effect Transistor (JFET), wherein the current comprises:
   a first portion underlying a first P-type Buried Layer (PBL), wherein the first portion of the current is further conducted through a first portion of an n-well region, with the n-well region between a first p-well region and a second p-well region; and
   a second portion through a second portion of the n-well region, wherein the second portion of the n-well region is between the first PBL and a second PBL;
   applying a voltage to a first gate of the JFET, wherein the voltage is applied from the first gate to the first p-well region; and
   applying the voltage to a second gate of the JFET, with the first gate and the second gate being on opposite sides of the source region, wherein the voltage is applied from the second gate to the second p-well region, and wherein the first portion of the current is pinched-off by first depletion regions formed due to the voltage.

2. The method of claim 1 further comprising:
   applying the voltage to a third p-well region, wherein the second p-well region and the third p-well region are on a same side of the source region, and wherein the second portion of the current is pinched-off by second depletion regions formed due to the voltage.

3. The method of claim 1, wherein the first portion of the current is pinched-off by the first depletion regions growing in a first direction parallel to a source-to-drain direction of the JFET.

4. The method of claim 3, wherein during a period of time in which the first portion of the current is pinched-off in the first direction, the first portion of the current is not pinched-off in a second direction perpendicular to the source-to-drain direction of the JFET.

5. The method of claim 3, wherein during a period of time in which the first portion of the current is pinched-off in the first direction, the first portion of the current is further pinched-off in a second direction perpendicular to the source-to-drain direction of the JFET.

6. The method of claim 1, wherein the second portion of the current comprises:
   a first sub-portion level with the first PBL and the second PBL; and
   a second sub-portion over the first PBL and the second PBL.

7. The method of claim 1, wherein during a period of time in which the current is pinched-off by the voltage, a first depletion region grown from the first p-well region is merged to a second depletion region grown from the second p-well region, with the first depletion region and the second depletion region comprised in the first depletion regions.

8. The method of claim 1 further comprising, during the applying the voltage to the second gate, applying the voltage to a gate electrode of a Metal-Oxide-Semiconductor (MOS) device, with the MOS device comprising the source region of the JFET as a source region of the MOS device.

9. The method of claim 1 further comprising, during the applying the voltage to the second gate, applying an additional voltage to a gate electrode of a Metal-Oxide-Semiconductor (MOS) device, with the MOS device comprising the source region of the JFET as a source region of the MOS device, and wherein the voltage and the additional voltage are different from each other.

10. The method of claim 1, wherein the voltage is an electrical grounding voltage or a negative voltage.

11. A method comprising:
    forming a buried well region of a first conductivity type over a substrate layer;
    forming a first High Voltage Well (HVW) region of the first conductivity type over the buried well region;
    forming an insulation region over the first HVW region;
    forming a drain region of the first conductivity type on a first side of the insulation region;
    forming a gate electrode on a second side of the insulation region;
    forming a well region of a second conductivity type in a region adjacent to the insulation region;
    forming a second HVW region of the first conductivity type overlapping a portion of the buried well region; and
    forming a source region of the first conductivity type in a top region of the second HVW region.

12. The method of claim 11, wherein the first conductivity type is n-type.

13. A method comprising:
    conducting a current between a source region and a drain region of a Junction Field-Effect Transistor (JFET), wherein the current comprises:
       a first portion underlying a first P-type Buried Layer (PBL), wherein the first portion of the current is further conducted through a first portion of an n-well region, with the n-well region between a first p-well region and a second p-well region, wherein the first p-well region and the second p-well region are both between the source region and the drain region; and
       a second portion through a second portion of the n-well region, wherein the second portion of the n-well region is between the first PBL and a second PBL;
    applying a first voltage to a first gate of the JFET, wherein the first voltage is applied from the first gate to the first p-well region; and
    applying a second voltage to a to a second gate of the JFET, wherein the second voltage is applied to the second p-well region, and wherein the second portion of the current is pinched-off by depletion regions induced by the first voltage and the second voltage.

14. The method of claim 13 further comprising:
    applying a third voltage to a third gate of the JFET, with the first gate and the third gate being on opposite sides of the source region, wherein the third voltage is applied from the third gate to a third p-well region, and wherein the first portion of the current is pinched-off by the depletion regions and an additional depletion region induced by the third voltage.

15. The method of claim 14, wherein the first portion of the current is pinched-off by the depletion regions and the additional depletion region growing in a first direction parallel to a source-to-drain direction of the JFET.

16. The method of claim 15, wherein during a period of time in which the first portion of the current is pinched-off in the first direction, the first portion of the current is not pinched-off in a second direction perpendicular to the source-to-drain direction of the JFET.

17. The method of claim 13, wherein the first voltage is equal to the second voltage.

18. The method of claim 13, wherein the second portion of the current comprises:
    a first sub-portion level with the first PBL and the second PBL; and
    a second sub-portion over the first PBL and the second PBL.

19. The method of claim 13, wherein during a period of time in which the current is pinched-off by the first voltage and the second voltage, a first depletion region grown from the first p-well region is merged to a second depletion region grown from the second p-well region, with the first depletion region and the second depletion region being parts of the depletion regions.

20. The method of claim 13 further comprising, during the applying the first voltage to the first gate, applying the second voltage to a gate electrode of a Metal-Oxide-Semiconductor (MOS) device, with the MOS device comprising the source region of the JFET as a source region of the MOS device.

* * * * *